United States Patent [19]

Goto et al.

[11] Patent Number: 5,369,871
[45] Date of Patent: Dec. 6, 1994

[54] DEVICE FOR FIXING BUS BARS TO INSULATING BOARD

[75] Inventors: Hideki Goto; Takafumi Higashio; Kenichiro Nakanishi; Shunji Taga, all of Yokkaichi, Japan

[73] Assignee: Sumitomo Wiring Systems, Ltd., Yokkaichi, Japan

[21] Appl. No.: 167,015

[22] Filed: Dec. 16, 1993

[30] Foreign Application Priority Data

Dec. 18, 1992 [JP] Japan ................. 4-355854
Aug. 9, 1993 [JP] Japan ................. 5-218002

[51] Int. Cl.$^5$ ............... H05K 3/00; B23P 23/00
[52] U.S. Cl. ........................... 29/564.6; 29/33 M; 29/838; 29/844
[58] Field of Search ........... 29/33 R, 33 M, 564.1, 29/566.2, 566.3, 753, 564.6, 564.7, 564.8, 34 R, 831, 838, 844, 845, 842

[56] References Cited

U.S. PATENT DOCUMENTS

| | | | |
|---|---|---|---|
| 3,508,315 | 4/1970 | Hoffken | 29/838 X |
| 4,205,433 | 6/1980 | Araki et al. | 29/564.8 X |
| 4,365,398 | 12/1982 | Chisholm | 29/845 |
| 4,467,523 | 8/1984 | Chisholm | 29/564.6 X |
| 4,763,412 | 8/1988 | Basavanhally et al. | 29/564.6 X |
| 4,825,538 | 5/1989 | Kubis | 29/842 X |
| 4,845,592 | 7/1989 | Himes, Jr. | 29/831 X |
| 4,959,018 | 9/1990 | Yamamoto et al. | 439/76 |
| 5,035,049 | 7/1991 | Wheeler | 29/844 X |
| 5,241,744 | 9/1993 | LeGrady et al. | 29/566.2 X |
| 5,263,247 | 11/1993 | Adachi et al. | 29/845 |

Primary Examiner—William Briggs
Attorney, Agent, or Firm—Oliff & Berridge

[57] ABSTRACT

A device for automatically fixing bus bars and after-fixing bus bars on an insulating board includes a workpiece setting table, on which a bus bar plate and an insulating board are set, is moved towards an upper die and a lower die, which are provided with an insulating board holding section and a bridge cutting and bus bar fixing section. The upper die is moved downwardly and upwardly, so that the bridges are removed from the bus bar plate, and the insulating board is picked up. Thereafter, an insulating board holding board holding the insulating board is moved to the bridge cutting and bus bar fixing section. The upper die is moved downwardly and upwardly again, so that bus bars are fixed onto the insulating board. As the upper die moves downwardly and then upwardly, the bridges are removed from the bus bar plate, and the insulating board and the intermediate product are lifted. Under this condition, the holding board is moved toward the cut punch plate, and the upper die is moved again downwardly and then upwardly, so that the first-fixing group of bus bars are fixed onto the insulating board while the after-fixing group of bus bars are fixed onto the intermediate product, whereby an intermediate product and a complete product are newly formed.

16 Claims, 13 Drawing Sheets

DEVICE FOR FIXING BUS BARS TO INSULATING BOARD

BACKGROUND OF THE INVENTION

This invention relates to a device for automatically fixing bus bars onto an insulating board, and more particularly to an apparatus that automatically performs cutting and fixing operations efficiently and without damaging the insulating board.

In a wiring junction box in an automobile, electrical conductors called "bus bars" are fixed onto an insulating board to form an electrical circuit. Heretofore, the bus bars are fixed onto the insulating board as follows:

As shown in FIG. 10, the bus bars are prepared as a bus bar plate (material) BP including a plurality of bus bars B, which are connected through bridges 2. Bridges 2 are cut and removed from the bus bar plate BP by using the punching section of a press, so that only the bus bars B remain. The bus bars B thus remaining are conveyed to a bus bar fixing station. An insulating board 3 has positioning grooves 59 in which the bus bars B are to be set. At the bus bar fixing station, the insulating board 3 is set over the bus bars B, and the bus bars B are fixed onto the insulating board 3 on a press.

In the above-described bus bar fixing operation, the insulating board 3 is manually set over the bus bars B. Accordingly, the bus bar fixing operation is low in work efficiency. In other words, heretofore no device is available that is able to perform the above-described series of manufacturing steps—the bridge cutting and removing step, the insulating board setting step, and the bus bar fixing step. Hence, there has been a strong demand for a device for automatically fixing bus bars onto an insulating board.

In order to set the insulating board 3 over the bus bars B, it is necessary to hold the insulating board 3 once. In this connection, a suction device may be employed for suctioning and retaining the insulating board, or the insulating board may be clamped with a plurality of cylinders. However, those methods are disadvantageous in that the insulating board is liable to be bent and deformed, which may make it impossible to fix the bus bars onto the insulating board. The insulating board is a thin plate of resin, and therefore it should be lifted and held with great care.

In an alternative arrangement, as shown in FIG. 16, the bus bars are similarly prepared as a bus bar plate (material) BP. The bus bars shown in FIG. 16 are so-called "after-fixing bus bars." The after-fixing bus bars are divided into a first-fixing group of bus bars BP1, which are firstly fixed onto the insulating board (to form a main circuit for instance), and an after-fixing group of bus bars BP2, which are coupled through bridges to the first-fixing group of bus bars (to form an auxiliary circuit for instance). The reason that the bus bars are divided into two groups and fixed on the insulating board separately in this arrangement is as follows:

In general, bus bars are arranged in a limited area on the insulating board to form electrical circuits; that is, it is necessary for the bus bars to use a minimum area on the insulating board. The bus bars are provided by blanking such that they form a predetermined pattern and have tabs at predetermined positions that are bent. Hence, it is necessary to provide a certain space between adjacent bus bars that is large enough to provide the tabs. In order to form electrical circuits with the bus bars of this type, it is necessary to use a large insulating board.

Among the bus bars, those that suffer from interference are separated so that they are fixed onto the insulating board at a different time from the time when the remaining are bus bars fixed. That is, the bus bars are not provided as one unit, and instead, they are divided into a plurality of groups that are fixed on the insulating board separately. This is the reason why the after-fixing bus bars have been proposed.

The after-fixing bus bars are fixed on the insulating board as follows: First, the bridges 2 are cut and removed from the bus bar plate BP with the punching section of a press, so that only bus bars B remain. The bus bars B thus remaining are conveyed to the bus bar fixing station. The insulating board 3 has positioning grooves 59 in which the bus bars B are to be set. At the bus bar fixing station, the insulating board is set over the bus bars B, and the bus bars B are fixed onto the insulating board on the press.

In the above-described punching operation, the bus bars of the bus bar plate are divided into the first-fixing group of bus bars and the after-fixing group of bus bars. As was described above, the after-fixing group of bus bars are provided outside of the first-fixing group of bus bars. Therefore, particular operations must be carried out. That is, it is necessary to rearrange the after-fixing group of bus bars and to take the bus bars thus rearranged in the first-fixing group of bus bars. However, heretofore, no device for automatically performing those operations is available, and the operations are carried out manually. In addition, the operator must set the insulating board over the bus bars thus rearranged. Hence, the conventional bus bar fixing operation is rather troublesome and suffers from poor work efficiency. This difficulty accompanying the after-fixing bus bars has been pointed out in the art; however, no suitable counter-measure has been proposed.

SUMMARY OF THE INVENTION

In view of the foregoing, an object of this invention is to provide a device that is able to automatically fix bus bars onto an insulating board, and another object is to provide an arrangement for preventing the insulating board from being bent during conveyance.

Yet another object of this invention is to provide a device that is able to automatically fix after-fixing bus bars onto an insulating board.

The foregoing objects of the invention have been achieved by providing a device for automatically fixing bus bars onto an insulating board, which, according to the invention, includes a workpiece setting table having an insulating board setting section for supporting the insulating board and a bus bar setting section for supporting a bus bar plate having the bus bars and a plurality of removable bridges. The insulating board setting section and the bus bar setting section are disposed adjacent one another. The setting stage also includes structure for moving the workpiece setting table between the setting stage and the processing stage. The processing stage includes a first die having a frame member and a die plate, wherein the die plate includes at least one cutting die, a second die disposed opposite the first die and movable toward and away from the first die, an insulating board holding section connected to the second die and movable between a first position and a second position along the second die. The insulating board holding section includes a system for lifting and holding the insulating board. The processing stage further includes a plurality of cutting punches fixed to the second die for cutting and removing the bridges from the bus bar plate, a device for moving the insulating board holding section between the first position and the second position such that the insulating board is moved to a position opposite the cutting punches, and a device for fixing the bus bars onto the insulating board after the insulating board is set to the position opposite the cutting punches.

The structure for moving the workpiece setting table can include a pair of rails disposed on the base, a pair of rail riders fixed to the workpiece setting table and riding on the pair of rails, a cylinder for driving the rail riders on the rails, and a coupling bracket fixing at least one of the rail riders to the piston. The system for lifting and holding the insulating board can include an insulating board holding board, a plurality of insulating board holding blocks disposed in a corresponding plurality of accommodating recesses formed in a first surface of the insulating board holding board, at least one holding pin extending from a second surface of the insulating board holding board, the at least one holding pin disposed adjacent the accommodating recesses through the insulating board holding board, at least one ejection pin corresponding to the at least one holding pin fixed to the second die, the at least one ejection pin contacting the at least one holding pin when the second die is moved toward the first die, the at least one ejection pin pushing the at least one holding pin into its corresponding one of the accommodating recesses, thereby pushing one of the insulating board holding blocks into a recess in the insulating board setting section, past the insulating board, and a ball plunger disposed in a plunger recess in each of the insulating board holding blocks, the ball plunger being urged out of the insulating board holding blocks by a spring, wherein the ball plunger is forced out when the insulating board holding blocks are pushed past the insulating board.

The system for moving the insulating board holding section can include a pair of rails fixed to the second die, a pair of rail riders fixed to the insulating board holding section and riding on the pair of rails, a cylinder for driving the rail riders on the rails, and a coupling bracket fixing at least one of the rail riders to the piston.

In another aspect of the invention, the insulating board setting section further includes structure for supporting an intermediate product adjacent the insulating board, wherein the bus bar setting section includes a device for supporting a first fixing group of bus bars and an after-fixing group of bus bars adjacent the first-fixing group of bus bars, the insulating board holding section further including a device for lifting and holding the intermediate product.

In the insulating board holding section, an insulating board holding board is suspended from the upper die, and a plurality of insulating board holding blocks adapted to hold the insulating board are provided in the lower surface of the insulating board holding board such that the insulating board holding blocks surround the outer periphery of the insulating board, and are allowed to go in and out of the lower surface of the insulating board holding board as the upper die moves up and down, each of the insulating board holding blocks includes a locking device that is detachably locked to the outer periphery of the insulating board.

At the setting stage, the bus bar plate and the insulating board are set side by side on the workpiece setting table. The workpiece setting table, on which the bus bar plate and the insulating board have been set, is moved to the processing stage.

Under this condition, the upper die is moved downwardly, so that the bridges are cut and removed from the bus bar plate with the cutting punches; that is, the bus bars remain. At the same time, the insulating board holding section is moved downwardly, so that the insulating board on the workpiece setting table is clamped. As the upper die is returned; i.e., as it is moved upwardly, the insulating board is raised and held there.

More specifically, as the upper die is moved downwardly, the insulating board holding blocks are protruded from the lower surface of the insulating board holding board, and the locking means are locked to the outer periphery of the insulating board at several points. The insulating board is raised when the upper die is moved upwardly.

The insulating board holding board, holding the insulating board, is moved below the cutting punches. When, under this condition, the upper and lower dies are closed, the bus bars are fitted in the insulating board as required, and the bus bars are fixed onto the insulating board by the fixing means. Thereafter, the insulating board, onto which the bus bars have been fixed, is taken out of the device.

In a second embodiment, the bus bar plate and the insulating board are set side by side on the workpiece setting table. An intermediate product, which is formed by fixing the first-fixing group of bus bars on the insulating board in the preceding bus bar fixing operation (described later), is set in place in parallel with the insulating board.

The workpiece setting table is moved to be set between the upper and lower dies, which are opened. Under this condition, the upper die is moved downwardly, so that the bus bars of the bus bar plate are divided with the cutting punches into the first-fixing group of bus bars and the after-fixing group of bus bars. On the other hand, the holding board is moved downwardly to clamp the insulating board and the intermediate product on the workpiece setting table. Those workpieces thus clamped are raised as the upper die returns and are held there.

When, after the holding board holding the insulating board is moved to be set below the cutting punches, the dies are closed again, the insulating board and the intermediate product are aligned with the first-fixing group of bus bars and the after-fixing group of bus bars, respectively, and the first-fixing group of bus bar and the after-fixing group of bus bars are fixed onto the insulating board and the intermediate product, respectively. Thereafter, the workpiece setting table is returned to its original position. Thus, an intermediate product and a complete product have been formed. The complete product thus formed is removed from the device. The intermediate product thus formed is shifted to the position where the complete product was, while a new insulating board is set at the position where the intermediate product was. Thus, the device becomes ready for a subsequent bus bar fixing operation.

BRIEF DESCRIPTION OF THE DRAWINGS

These and other aspects and advantages of the present invention will become apparent from the following detailed description of preferred embodiments when taken in conjunction with the accompanying drawings, in which.

DETAILED DESCRIPTION OF PREFERRED EMBODIMENTS

Figure 1:
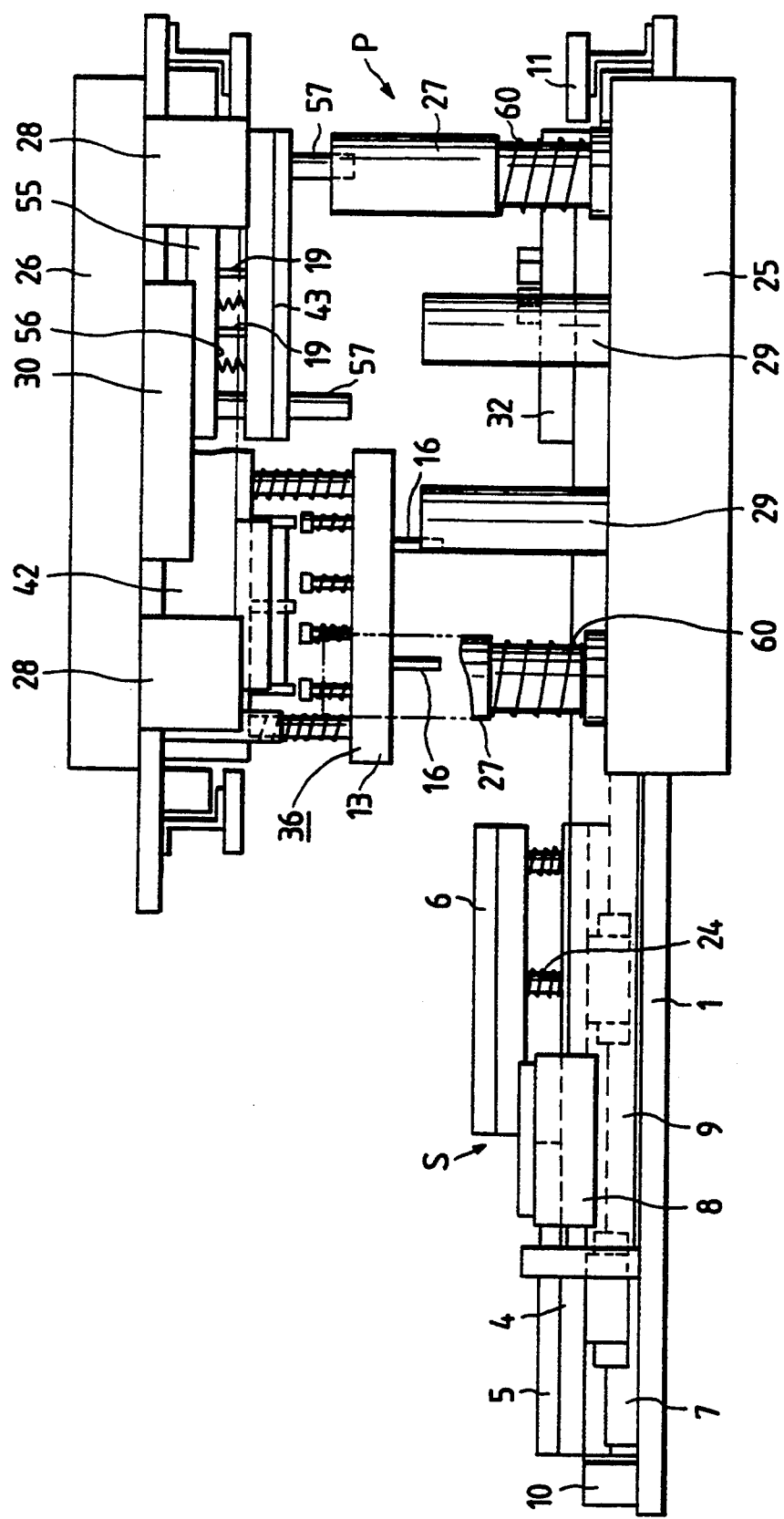
FIG. 1 is a front view showing the arrangement of a device for fixing bus bars onto an insulating board according to this invention.

A first preferred embodiment of this invention will be described with reference to the accompanying drawings in detail.

In the accompanying drawings, reference numeral 1 designates a base, on which a setting stage S, and a processing stage P are provided. At the setting stage S, the operator sets a bus bar plate BP and an insulating board 3. As was described before, the bus bar plate BP includes bus bars B that are connected through bridges 2 to one another. At the processing stage P, the bridges 2 are cut and removed from the bus bar plate BP leaving only the bus bars B, and the bus bars B thus left are fixed onto the insulating board 3.

Figure 3:
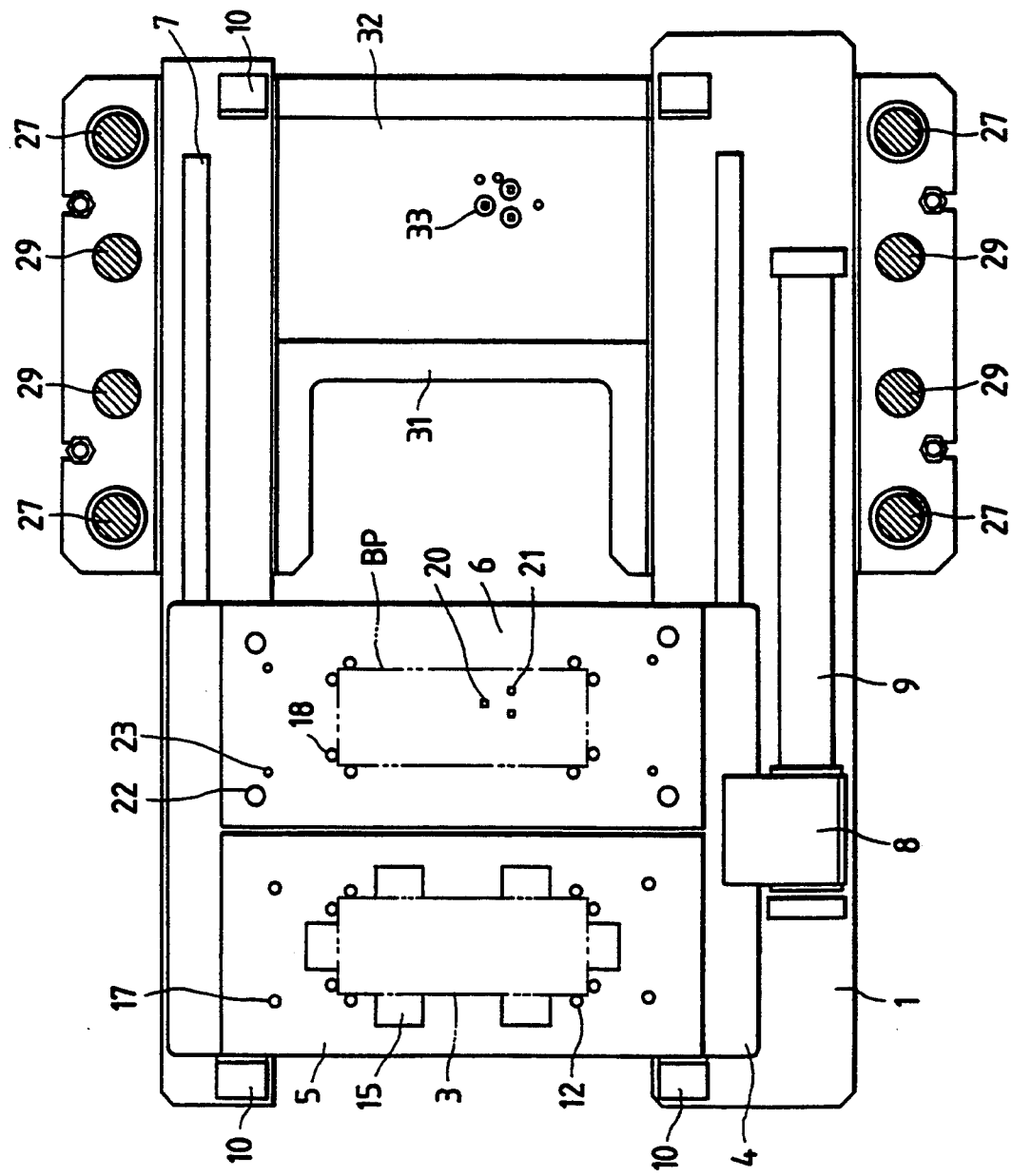
FIG. 3 is a plan view, with parts cut away, showing the device of the invention.
Figure 4:
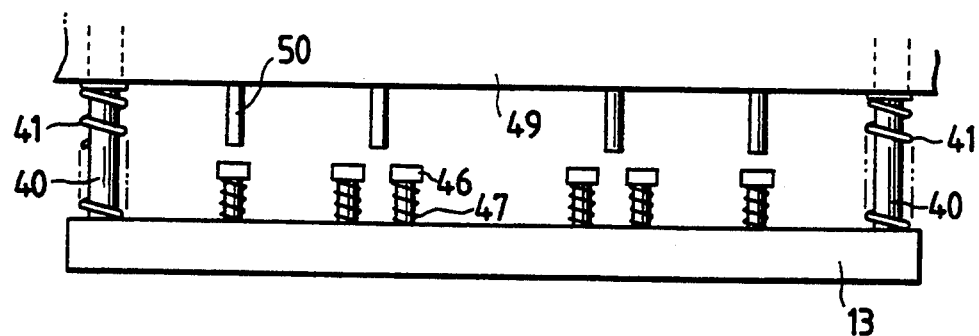
FIG. 4 is a side view showing an insulating board holding board in the device of the invention.

At the setting stage S, a workpiece setting table 4 is provided that is used to set the insulating board 3 and the bus bar plate BP side by side. The workpiece setting table 4 has a plate 5 (on the left side thereof in FIG. 1) on which the insulating board 3 is placed (hereinafter referred to as "an insulating board setting section 5," when applicable), and a plate 6 (on the right side thereof in FIG. 1) on which the bus bar plate BP is placed (hereinafter referred to as "a bus bar setting section 6," when applicable). The workpiece setting table 4 is mounted on a pair of rails 7 laid between the two stages S and P. The table 4 is moved back and forth between the two stages S and P by the piston rod of a cylinder (such as an air cylinder) 9. The cylinder 9 is arranged outside one of the rails such that it extends parallel to the rail (as shown in FIG. 3). The rod of the cylinder is coupled through a coupling bracket 8 to the workpiece setting table 4.

In order to stop the workpiece setting table 4 at predetermined positions in the stages S and P, four table stoppers 10 are provided on the base 1 at four corners, respectively. In order to detect when the workpiece setting table 4 reaches the predetermined position in the processing stage P, a limit switch 11 is provided at the end of the rail 7. Air charging and discharging operations for the cylinder 9 are controlled in response to the on and off operations of the limit switch 11. An operating switch (not shown) is provided to supply air to the cylinder 9 to move the workpiece setting table 4.

The insulating board 3 is set at the center of the insulating board setting section 5. A plurality of positioning pins 12 are embedded in the insulating board setting section 5 such that they surround the insulating board 3. At the processing station P, the insulating board 3 thus set is raised and held by holding blocks 14 of an insulating board holding board 13 (described later) (cf. FIGS. 5 and 6). In order to prevent the interference with the insulating board holding board 13 in raising the insulating board 3, relief recesses 15 are formed around the region where the insulating board 3 is set. In addition, four through-holes 17 are formed in the insulating board setting section 5 at four corners, respectively, into which positioning pins 16 of the insulating board holding board are inserted.

Similarly as in the case of the insulating board setting section 5, in the bus bar setting section 6, a plurality of positioning pins 18 are embedded. Relief holes 20 are formed in the region defined by those positioning pins 18, to allow the passage of cutting punches 19 (described later) adapted to cut the bridges 2 (only one relief hole 20 shown in FIG. 3). The bus bar setting section 6 has returning protrusions 21 where it confronts with the holding blocks 14 when the insulating board holding board 13 is set above the holding blocks 14 for fixing the bus bar (cf. FIG. 7) (described later in detail). In addition, the bus bar setting section 6 has four through-holes 22 respectively at four corners into which the positioning pins 57 of a stripper plate 43 (described later) are inserted, and four through-holes 23 into which the positioning pins 16 of the insulating board holding board 13 are inserted, respectively. Cushion means, namely, springs 24 are arranged on the lower surface of the bus bar setting section 6 such that three springs 24 are provided along each of two opposite edges thereof.

The processing stage P will now be described in more detail. The processing stage P has a lower die 25 and an upper die 26 that is moved vertically by an air source (not shown). In order to guide the vertical movement of the upper die 26, guide posts 27 are provided on the lower die 25 such that two guide posts 27 are arranged along each of two opposite edges thereof. Each of the guide posts 27 is provided with cushion means, namely, a spring 60. Guide cylinders 28 are extended downwardly from the upper die 26 such that they are engaged with the guide posts 27, respectively. In order to regulate the lower position of the upper die 26, height stoppers 29 are extended upwardly from the lower die such that two height stoppers 29 are arranged between the two adjacent guide posts 27. In order to decrease noises that may be produced in cutting the bridges of the bus bar plate, a cushion board 30 of urethane rubber is mounted on the upper die 26 such that it is abutted against the height stoppers 29 in the bridge cutting operation.

Figure 10:
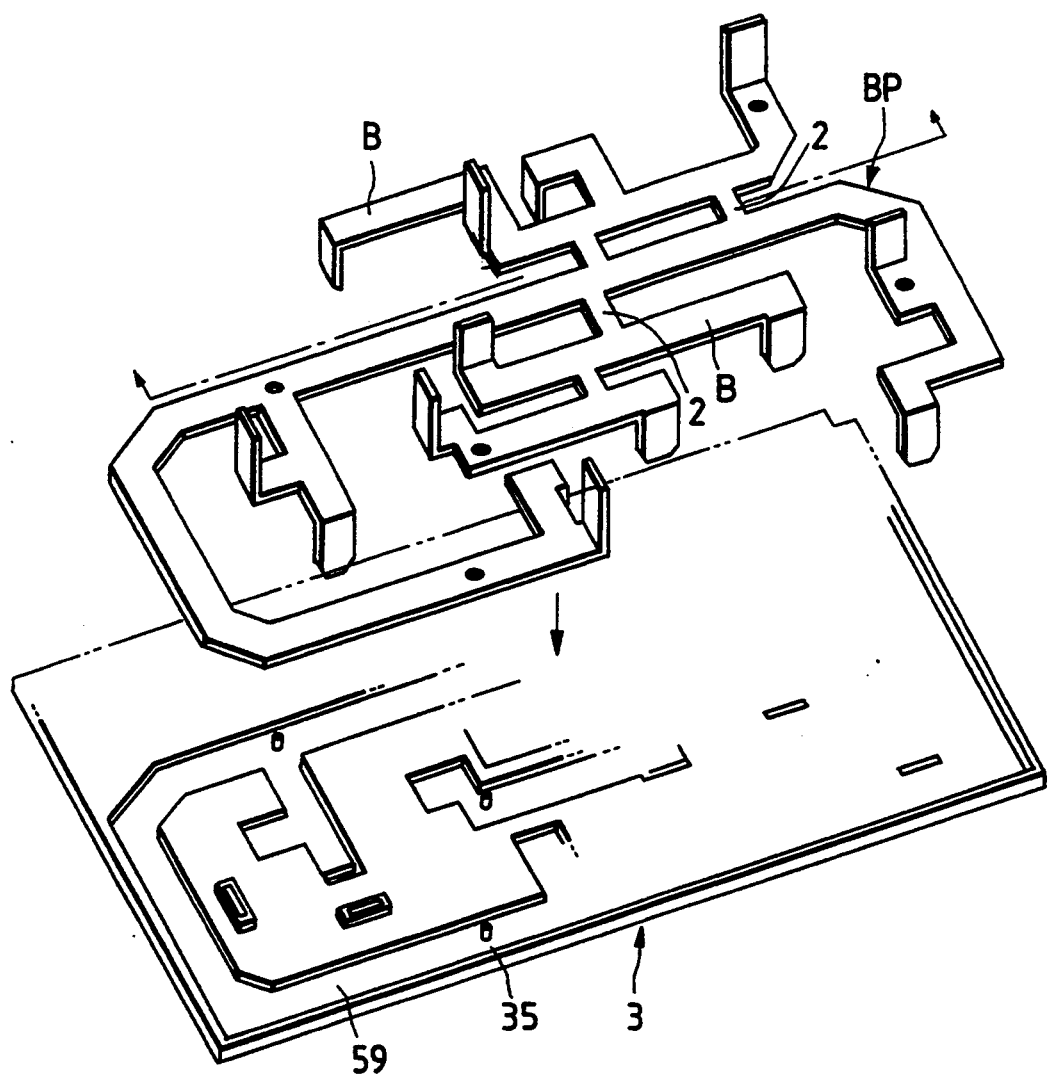
FIG. 10 is an exploded perspective view showing a bus bar plate and an insulating board.

As shown in FIG. 3, the lower die 25 has a substantially U-shaped frame member 31 at the position where the insulating board setting-section 5 is located when the workpiece setting table 4 comes in the processing stage P and a die plate 32 at the position where the bus bar setting section 6 is located. The die plate 32 has a number of cutting dies 33 that are used to cut the bridges 2 of the bus bar plate BP (only some of them shown for simplification in illustration). Each of the cutting dies 33 is in the form of a cylindrical boss, into which the respective cutting punch 19 is inserted (described later). In order to fix the bus bars onto the insulating board, a number of fixing pins 34 are embedded in the upper surface of the die plate 32. More specifically, the fixing pins 34 are adapted to flatten fixing protrusions 35 (cf. FIG. 10) which are extended, through the bus bars B, from the insulating board 3.

An insulating board holding section 36 is provided on the lower surface of the upper die 26 (on the left side thereof in FIG. 1). Insulating board holding section 36 operates to lift and hold the insulating board 3, which has been conveyed from the setting stage S to the processing stage P by the workpiece setting table 4.

Figure 2:
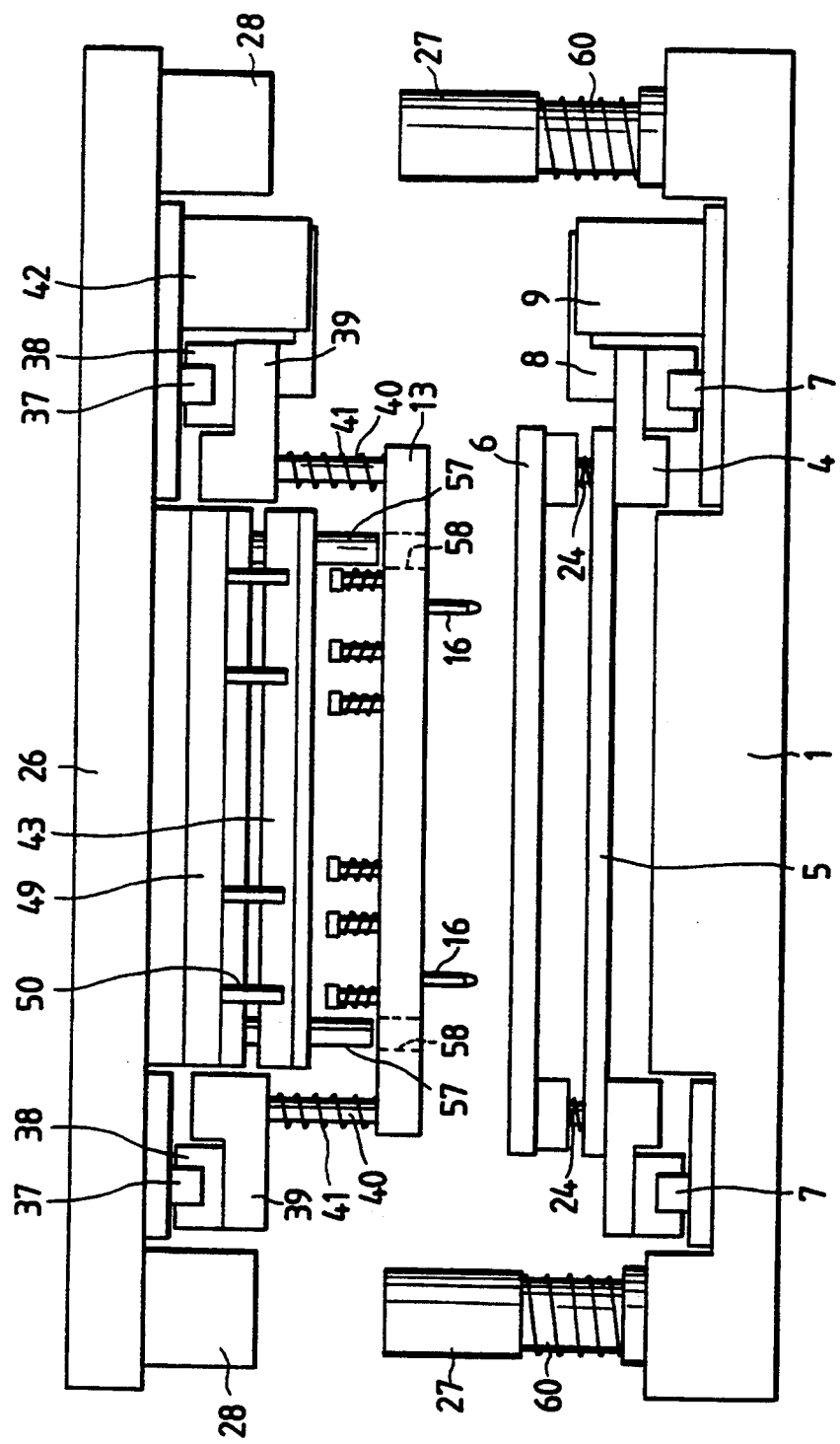
FIG. 2 is a side view of the device of the invention.

At the insulating board holding section 36, a pair of guide rails 37 are provided on the lower surface of the upper die 26 such that they are extended in a right-to-left direction in FIG. 1. As shown in FIG. 2, sliders 38 are engaged with the guide rails 37, respectively, and two supporting members 39 are fixedly secured to the sliders 38, respectively. The aforementioned insulating board holding board 13 is suspended from the supporting members 39 through suspending pins 40, on which springs 41 are wound. A cylinder 42 is provided on the lower surface of the upper die 26 such that it is laid outside one of the guide rails 37 (the right one in FIG. 2). The piston rod of the cylinder 42 is coupled to the supporting member 39 (the right one in FIG. 2). Therefore, as the piston rod of the cylinder 42 moves, the insulating board holding board 13 is moved along the guide rails 37 to and from the lower surface of the stripper plate 43 located adjacent the board 13. In order to detect when the insulating board holding board 13 reaches the end of stroke, a detecting limit switch (not shown) is mounted on the upper die. Air charging and discharging operations for the cylinder 42 are controlled in response to the on and off operations of the limit switch.

A mechanism for lifting and holding the insulating board 3 will be described.

Figure 5:
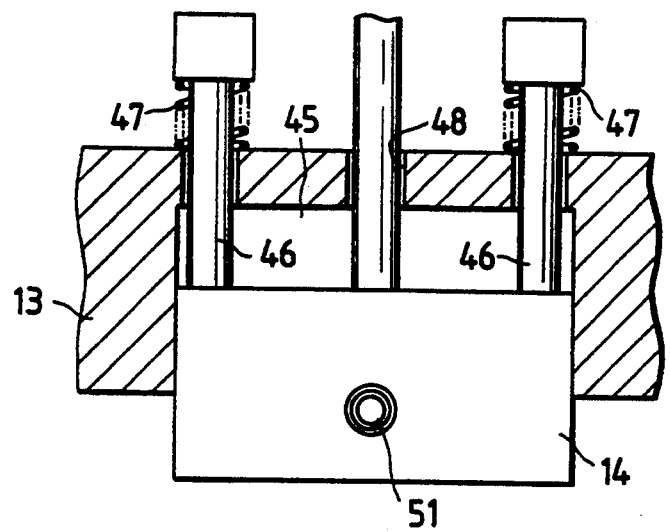
FIG. 5 is a sectional front view showing an insulating board holding block and its relevant components in the device of the invention.
Figure 6:
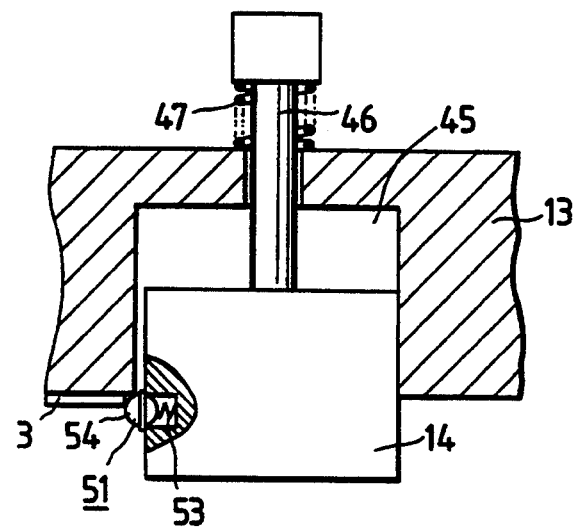
FIG. 6 is a sectional side view, with parts cut away, showing the insulating board holding block and its relevant components.

As shown in FIGS. 5 and 6, the insulating board holding blocks 14 are provided in the lower surface of the insulating board holding board 13 such that they surround the insulating board 3. More specifically, the insulating board holding blocks 14 are set in accommodating recesses 45 formed in the lower surface of the insulating board holding board 13, and their lower surfaces are normally substantially flush with the lower surface of the insulating board holding board 13. Two pins 46 are extended from the upper surface of each holding block 14 and loosely inserted into the upper surface of the insulating board holding board 13. Return springs 47 are wound on the pins 46 to suspend the holding block 14. Through-holes 48 are formed in the upper surface of the insulating board holding board 13 such that they are communicated with the accommodating recesses 45, respectively. In association with the closure of the dies, ejection pins 50 (FIG. 2), which are extended downwardly from a pin plate 49 secured to the upper die 26, are inserted into the through-holes 48, respectively, so that the holding blocks 14 are slightly protruded from the lower surface of the insulating board holding board 13. Each of the holding blocks 14 has a ball plunger (locking means) 51 in its surface that is confronted with the periphery of the insulating board 3 when it is protruded from the lower surface of the insulating board holding board 13 in the above-described manner. Each of the ball plungers 51 comprises a ball 54 and a spring 53 urging the ball 54 to engage the periphery of the insulating board holding board 13 from below.

Figure 8:
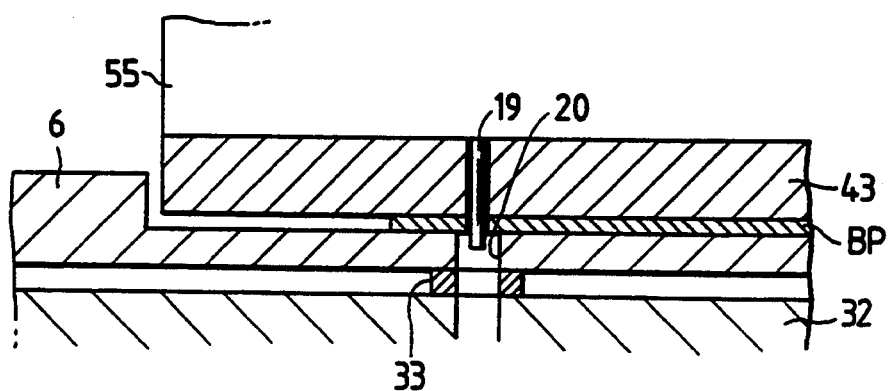
FIG. 8 is a sectional view for a description of an operation of cutting and removing bridges with cutting punches in the device of the invention.
Figure 9:
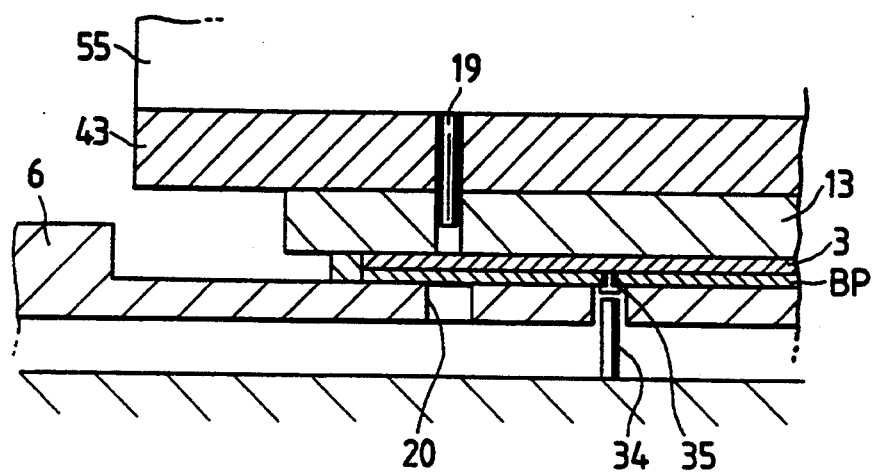
FIG. 9 is a sectional view showing the position of each of the cutting punches in a bus bar fixing operation.

The upper die has a mechanism for removing the bridges 2 from the bus bar plate BP and fixing the remaining bus bars B onto the insulating board 3. That is, a cut punch plate 55 is fixedly mounted on the lower surface of the upper die 26 such that it does not interfere with the forward movement of the insulating board holding board 13. The aforementioned cutting punches 19 are extended from the lower surface of the cut punch plate 55 so as to meet the bridges 2 of the bus bar plate BP. The stripper plate 43 is provided below the cut punch plate 55. More specifically, the stripper plate 43 is elastically suspended from the cut punch plate through several springs 56, so that it may be elastically brought into contact with the bus bars. As shown in FIG. 8, the cutting punches 19 are loosely inserted into the stripper plate 43. As the upper die 26 moves downwardly, each of the cutting punches 19 is pushed against the bus bar plate BP, thus cutting the respective bridge 2, and is pushed into a cutting die 33 on the die plate 32. As shown in FIG. 9, when the insulating board holding board 13 is positioned below the cut punch plate 43 in the bus bar fixing operation, the cutting punches 19 cannot reach the surface of the insulating board 3 because of the thickness of the insulating board holding board 13; that is, their ends are held within the stripper plate 43. Positioning pins 57 are embedded in the lower surface of the stripper plate 43 at four corners such that they are extended downwardly therefrom. The positioning pins 57 can be inserted into the through-holes of the bus bar setting section 6, and, when the insulating board holding board 13 is positioned below (for the bus bar fixing operation), they can be inserted into relief through-holes 58 formed in the insulating board holding board 13.

The operation of the device designed as described above is controlled by a control unit (not shown). A sensor (not shown) is provided for the lower die 25 to detect whether or not the insulating board 3 and the bus bar plate BP are correctly positioned on the workpiece setting table 4. That is, with the device, the bus bar fixing operation is carried out with no errors.

Figure 11:
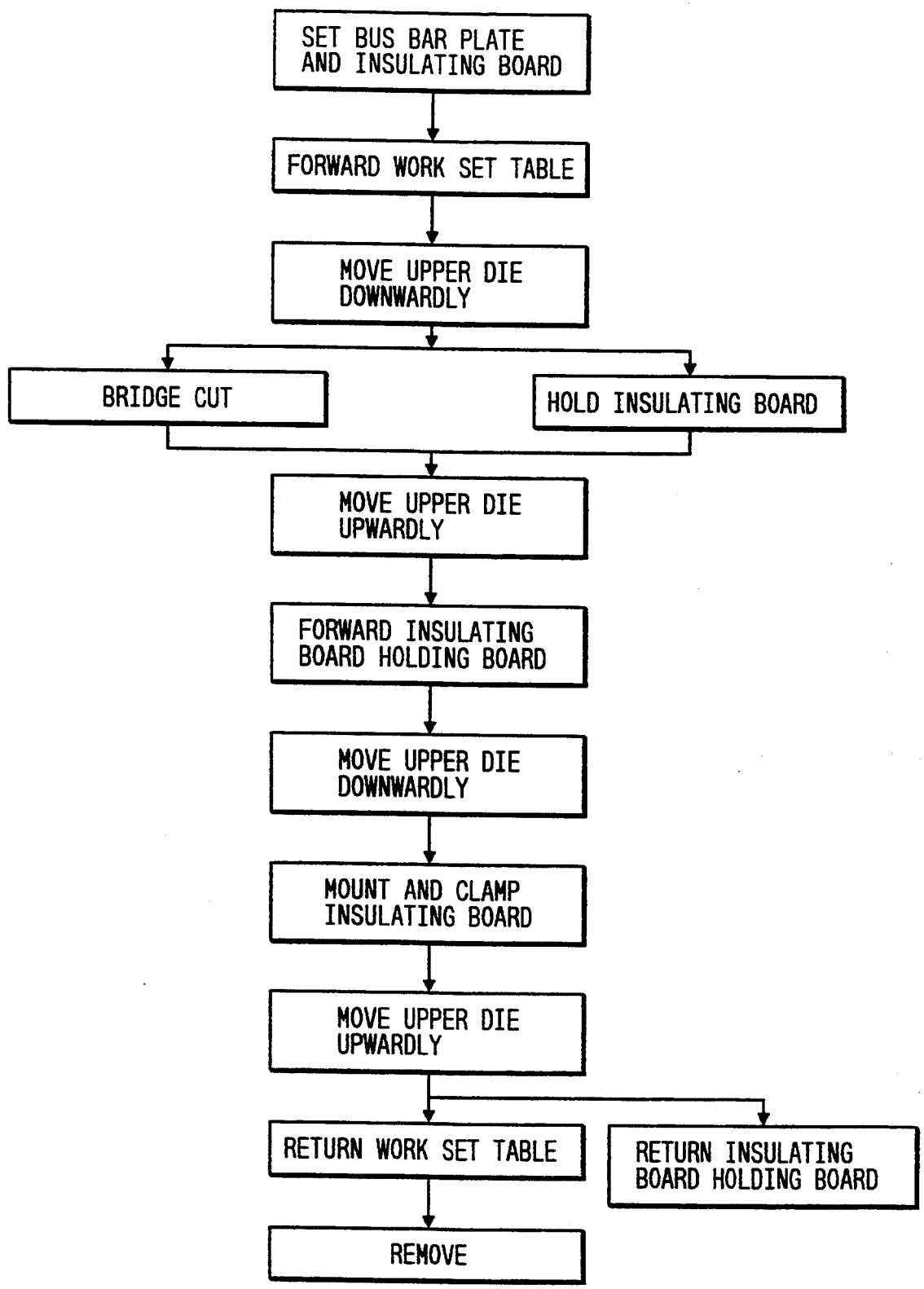
FIG. 11 is a flow chart showing the order of operations of the device of the invention.

The functions and effects of the device organized as described above will be concretely described according to FIG. 11, which is a flow chart showing the order of operations of the device.

First, the operator sets the insulating board 3 and the bus bar plate BP on the workpiece setting table 4. More specifically, the insulating board 3 is set at the insulating board setting section 5 with the positioning pins 12, while the bus bar plate BP is set at the bus bar setting section 6 with the positioning pins 18.

Under this condition, the operator operates an operating switch (not shown) to supply air to the cylinder 9, so that the workpiece setting table 4 is moved to the processing stage P while being guided by the rails 7. When the limit switch 11 detects that the workpiece setting table 4 abuts against the table stoppers 10; that is, when the table 4 is positioned in place, the supplying of air to the cylinder 9 is suspended, so that the workpiece setting table 4 is held at the predetermined position.

Thereafter, the upper die 26 is moved downwardly. In this operation, the insulating board 3 is clamped, and the bridges 2 are cut and removed from the bus bar plate BP. The clamping of the insulating board 3 will be described in more detail. As the upper die 26 is moved downwardly, the positioning pins 16 of the insulating board holding board 13 are inserted into the through-holes 17 of the insulating board setting section 5, so that the insulating board holding board 13 is locked to the insulating board setting section 5, while the insulating board holding board 13 elastically pushes the insulating board 3 against the insulating board setting section 5. As the upper die 26 is further moved downwardly, the pin plate 49 approaches the insulating board holding board 13. As a result, as shown in FIGS. 5 and 6, the ejection pins 50 of the pin plate 49 push the upper surfaces of the respective holding blocks 14 through the through-holes 48, so that the holding blocks 14 are protruded downwardly from the lower surface of the insulating board holding board 13, and fitted in the relief recesses 15, whereby the ball plungers 51 are locked to the periphery of the insulating board 3; that is, the balls 54 of the ball plungers 51 support the insulating board 3 at a plurality of points. Hence, even if the insulating board 3 is a bent one, it is positively clamped.

After the insulating board 3 has been clamped in the above-described manner, the upper die 26 is moved upwardly. Therefore, the pin plate 49 is moved away from the insulating board holding board 13, and the holding blocks 14 are released from the ejection pins 50. On the other hand, as the upper die 16 moves upwardly, the insulating board 3 is moved upwardly because the ball plungers 51 are locked to the insulating board 3 by springs 53.

Simultaneously with the above-described insulating board clamping operation, the bridge cutting and removing operation is carried out. As the upper die 26 is moved downwardly, the positioning pins 57 of the stripper plate 43 are inserted into the through-holes 22 of the bus bar setting section 6. The stripper plate 43 is elastically brought into contact with the bus bar plate BP. When, under this condition, the upper die 26 is further moved downwardly, as shown in FIG. 8, the cutting punches 19 of the cut punch plate 55 are protruded through the stripper plate 43, so that the bridges 2 are removed from the bus bar plate B; that is, only the bus bars B remain. In this operation, the bridges 2 thus removed are thrown away through the cutting dies 33.

When the upper die 26 has been moved upwardly after the insulating board clamping operation and the bridge cutting and removing operation, the cylinder 42 is operated in response to an instruction from the control section (not shown), so that the insulating board holding board 13 holding the insulating board 3 is moved toward the stripper plate 43 while being guided by the guide rails 37. When the limit switch (not shown) detects that the holding board 13 has reached the end of its stroke, the operation of the cylinder 42 is suspended, and the insulating board holding board 13 is held below the stripper plate 43.

Figure 7:
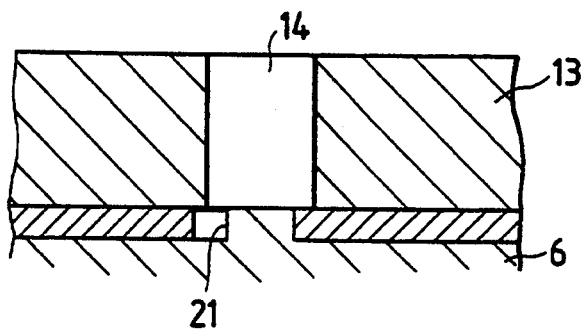
FIG. 7 is a sectional side view for a description of the returning operation of the insulating board holding block.

Under this condition, the upper die 26 is moved downwardly again. As a result, while the insulating board holding board 13 is positioning the bus bar setting section 6, the insulating board 3 is laid over the bus bars B, whereby the bus bars B are fitted in the insulating board 3 as required, and the fixing protrusions 35 of the insulating board 3 are protruded through the bus bars B, thus appearing over the lower surface of the bus bar setting section 6. The upper die 26 is further moved downwardly, so that the insulating board holding board 13 is brought into close contact with the stripper plate 43, to push the insulating board 3. As a result, the fixing protrusions 35 are flattened by the fixing pins 34, so that the bus bars B are fixed onto the insulating board 3. During this bus bar fixing operation, as shown in FIG. 9, the insulating board holding board 13 is positioned under the stripper plate 43, thus preventing the cutting punches 19 from reaching the insulating board 3; that is, the insulating board 3 will never be broken by the cutting punches 19. As shown in FIG. 7, simultaneously when the bus bars are fixed onto the insulating board 3, the insulating board holding blocks 14 are pushed upwardly by the returning protrusions 21 of the bus bar setting section 6, respectively, so that the ball plungers 51 are disengaged from the insulating board 6, and the holding blocks 14 are set back into the accommodating recesses 45.

As is apparent from the above description, when the insulating board holding board 13 is moved upwardly together with the upper die 26, the insulating board 3, onto which the bus bars B have been fixed, remains on the bus bar setting section 6. After the upper die 26 has been moved upwardly in the above-described manner, the insulating board holding board 13 and the workpiece setting table 4 are returned to their original positions by means of the cylinders 9 and 42, respectively, and the insulating board 3 with the bus bars B is removed from the device. That is, the device becomes ready for a subsequent bus bar fixing operation.

As was described above, with the device of the invention, the series of manufacturing steps from the step of cutting and removing the bridges 2 up to the step of holding the insulating board and fixing the bus bars B onto the insulating board 3 are all automatically carried out, and the insulating board holding operation and the bridge cutting and removing operation are performed in a parallel mode; that is, the manufacture is achieved with high efficiency, reducing the cycle time. In the device of the invention, the insulating board 3 is held by the locking means using the ball plungers 51, and the system is not employed in which the insulating board 3 is clamped by using vacuum means or by applying compression forces to it from both sides. Therefore, the device is considerably effective in handling the insulating board 3, which is generally a thin resin plate and is liable to be bent. Hence, with the device, the bus bars can be fixed onto the insulating board smoothly with high work efficiency.

After the insulating board and the bus bar plate are set on the workpiece setting table, the series of manufacturing steps including the bridge removing step, the insulating board moving step, and the bus bar fixing step are carried out automatically. That is, with the device, the bus bars can be fixed onto the insulating board with high efficiency.

Furthermore, in the device of the invention, the insulating board is locked to the insulating board holding board with the locking means. Therefore, with the device of the invention, unlike those that use a suction force or compression force to hold the insulating board, the insulating board will never be bent during manufacture, and therefore the bus bars can be smoothly fixed onto the insulating board.

A device for automatically fixing bus bars on an insulating board, which constitutes a second embodiment of this invention, will be described with reference to the drawings, wherein like reference numerals are utilized to designate similar elements to those described above.

Figure 12:
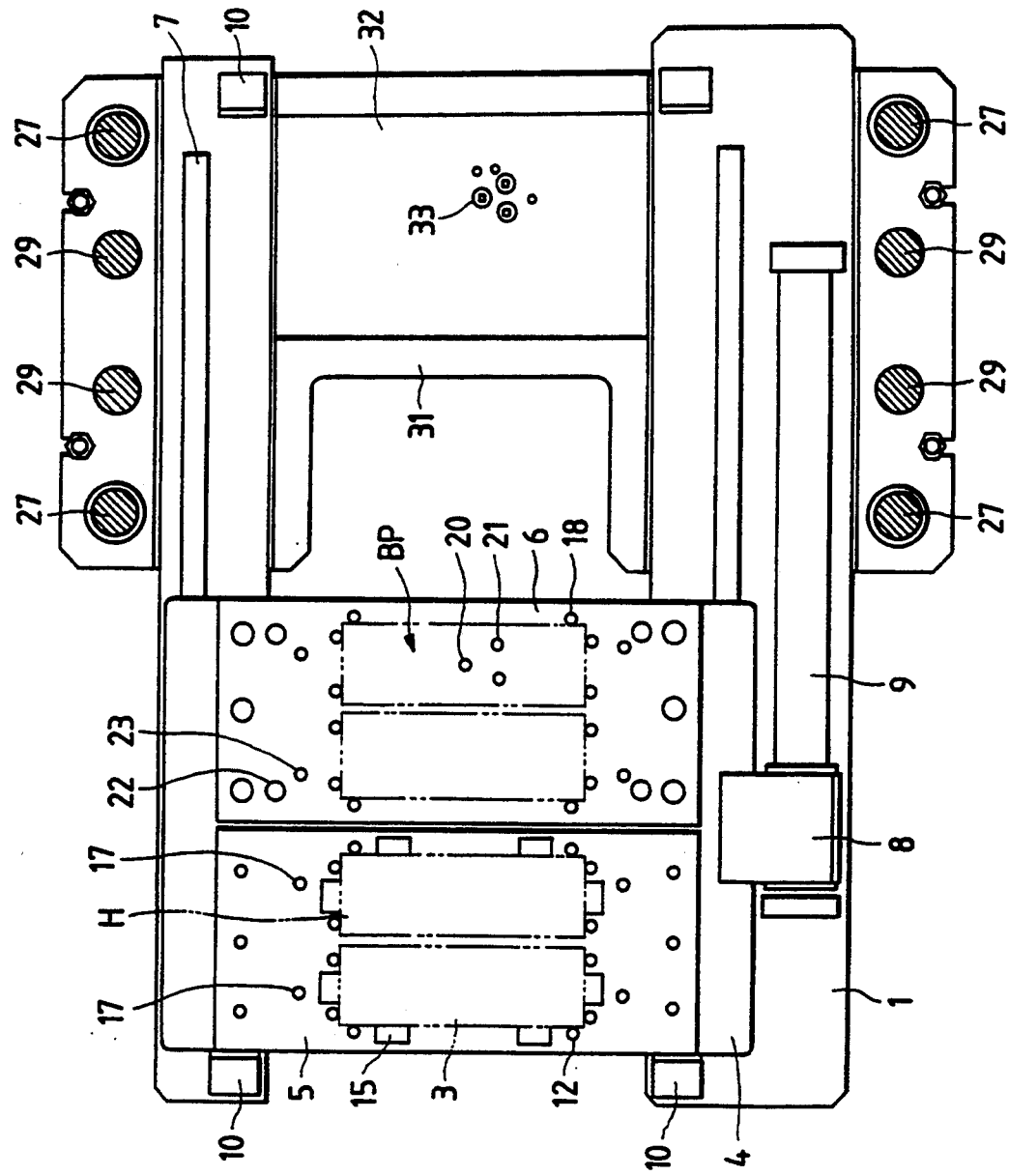
FIG. 12 is a plan view, with parts cut away, showing the device in the second embodiment of the invention.

First, referring to FIGS. 1, 2 and 12, the arrangement of the embodiment according to the invention will be outlined. As shown in FIG. 1, a setting stage S and a processing stage P are provided on a base 1. At the setting stage S, an insulating board and a bus bar plate of after-fixing type (hereinafter referred to merely as "a bus bar plate BP," when applicable) are set. At the processing stage P, the bridges of the bus bar plate BP are cut and removed, so that bus bars are left that are divided into an after-fixing group of bus bars and a first-fixing group of bus bars, and thereafter, those fixing groups of bus bars are fixed onto the insulating board. In the device of the invention, an intermediate product forming step in which the first-fixing group of bus bars are fixed on the insulating board to form an intermediate product H, and a complete article forming step in which the after-fixing group of bus bars are fixed onto the intermediate product H to form a complete product F are carried out simultaneously.

At the setting stage S, a workpiece setting table 4 is provided that is used to set the insulating board 3, the intermediate product H, and the bus bar plate BP. The workpiece setting table 4 has a plate 5 (on the left side thereof in FIG. 12) on which the insulating board 3 is placed (hereinafter referred to as "an insulating board setting section 5," when applicable), and a plate 6 (on the right side thereof in FIG. 12) on which the bus bar plate BP is placed (hereinafter referred to as "a bus bar setting section 6," when applicable).

At the insulating board setting section 5, the insulating board 3 and the intermediate product H are set side by side. A plurality of positioning pins 12 are embedded in the insulating board setting section 5 such that they surround the insulating board 3 and the intermediate product H. A plurality of relief recesses 15 are formed around the region where the insulating board 3 and the intermediate product H are set.

The insulating board and the intermediate product H thus set are moved to the processing stage P by the workpiece setting table 4. At the processing stage P, the insulating board 3 and the intermediate product H are lifted and held by holding blocks 14 of a holding board 13 (cf. FIGS. 5 and 6). In this operation, in order to prevent the interference of the holding blocks 14, the relief recesses 15 are formed as described above. In addition, four through-holes 17 are formed in the insulating board setting section 5 at four corners, respectively, into which positioning pins 16 of the holding board 13 are inserted.

In the bus bar setting section 6, similarly as in the case of the insulating board setting section 5, a plurality of positioning pins 18 are provided. The after-fixing group of bus bars are set closer to the processing stage P, and the distance between the after-fixing group of bus bars and the first-fixing group of bus bars is equal to the distance between the insulating board 3 and the intermediate product H at the insulating board setting section 5.

Relief holes 20 are formed in the region defined by positioning pins 18, to allow the passage of cutting punches 19 that are adapted to cut the bridges 2 (only one relief hole 20 shown in FIG. 12). The bus bar setting section 6 has protrusions 21 corresponding to the holding blocks 14.

In a bus bar fixing operation, the protrusions 21 push the holding board 13 to forcibly disengage the holding blocks from the insulating board 3. In addition, the bus bar setting section 6 has four through-holes 22 respectively at four corners into which the positioning pins 57 of a stripper plate 43 are inserted and four through-holes 23 into which the positioning pins 16 of the holding board 13 are inserted, respectively. Cushion means, namely, springs 24 are arranged on the lower surface of the bus bar setting section 6 such that three springs 24 are provided along each of two opposite edges thereof.

Figure 15:
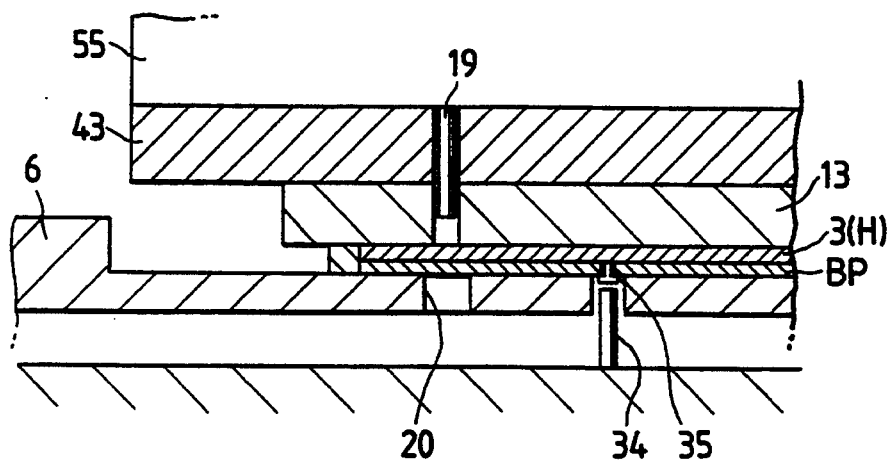
FIG. 15 is a sectional view showing the position of each of the cutting punches in a bus bar fixing operation.
Figure 16:
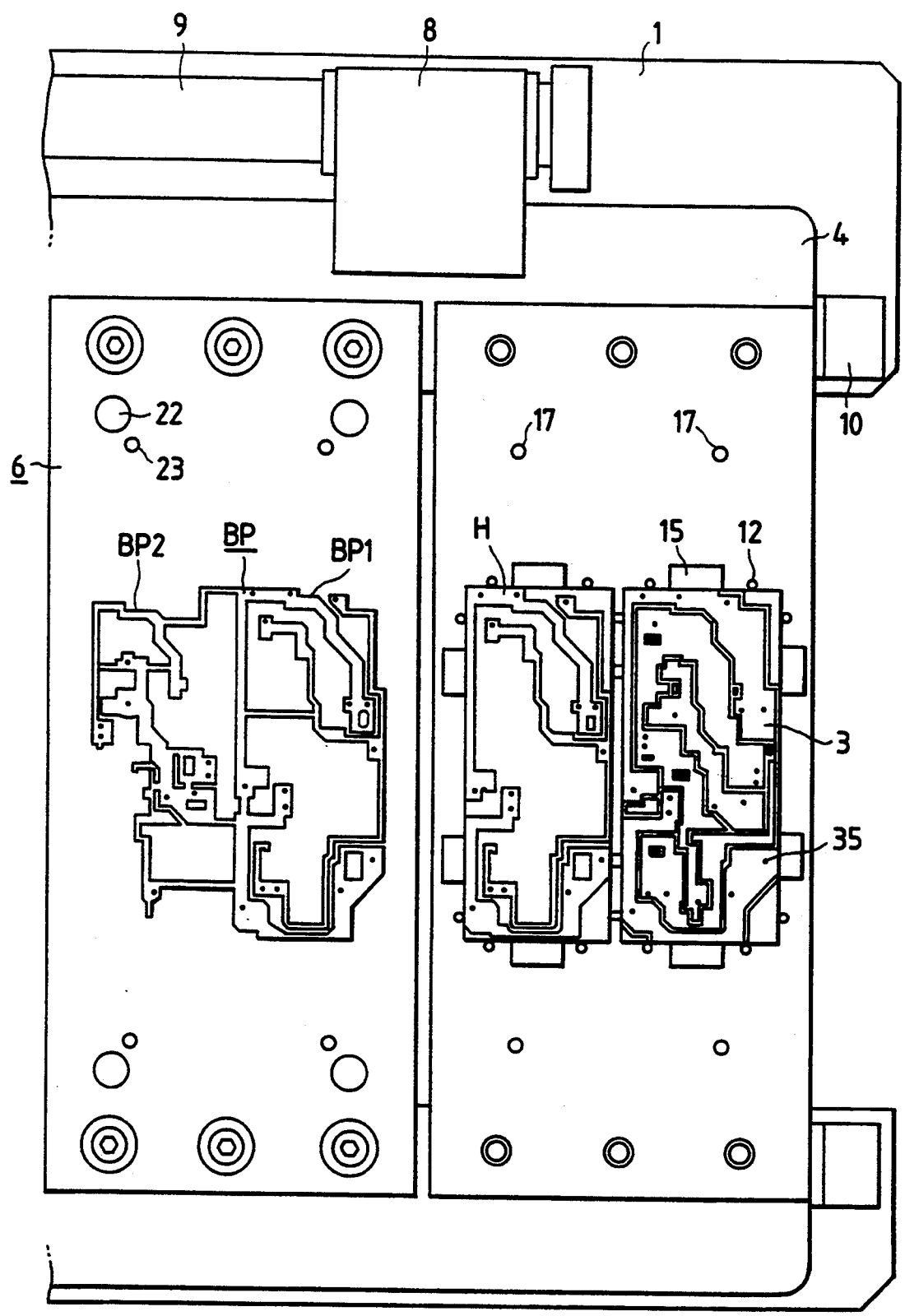
FIG. 16 is a plan view showing workpieces, such as an insulating plate and a bus bar plate set, on a workpiece setting table in the device of the invention.
Figure 17:
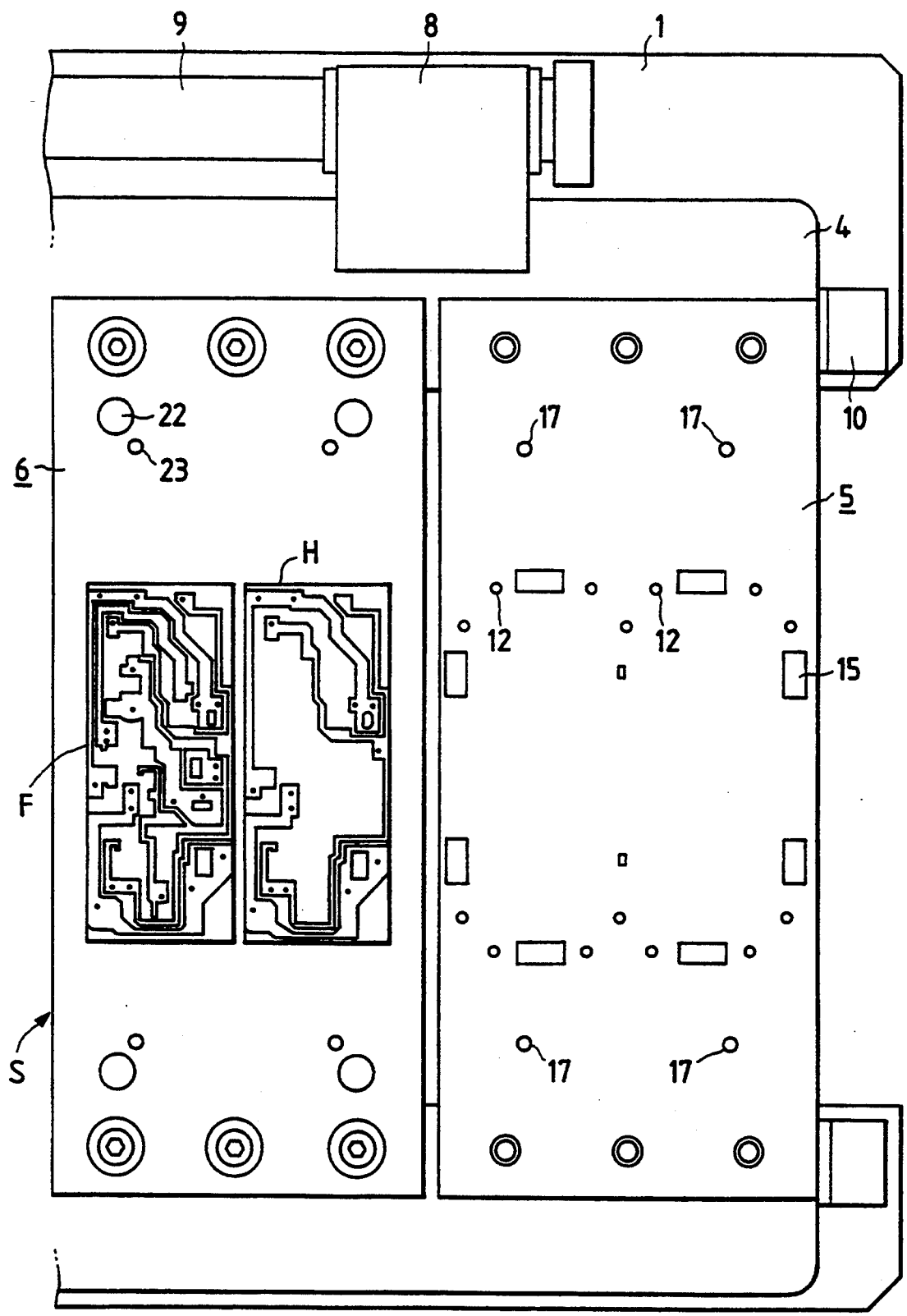
FIG. 17 is a plan view showing a complete product together with an intermediate product on the workpiece setting table.
Figure 18:
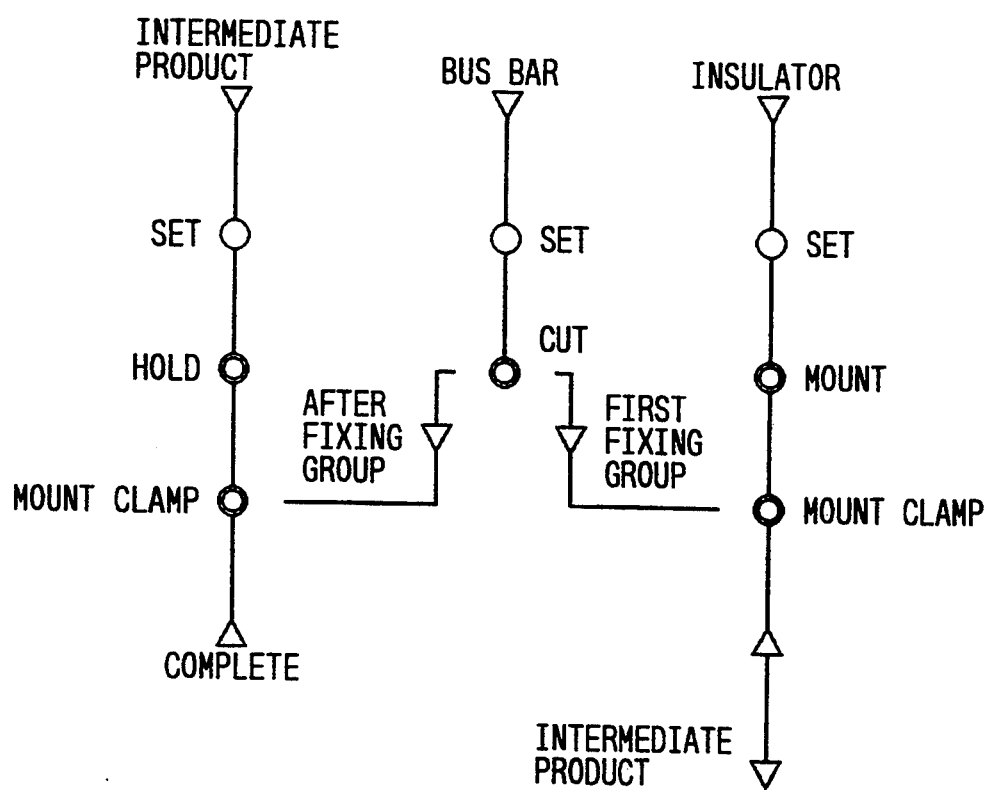
FIG. 18 is a flow chart outlining the operating procedure of the second embodiment of the invention.
Figure 19:
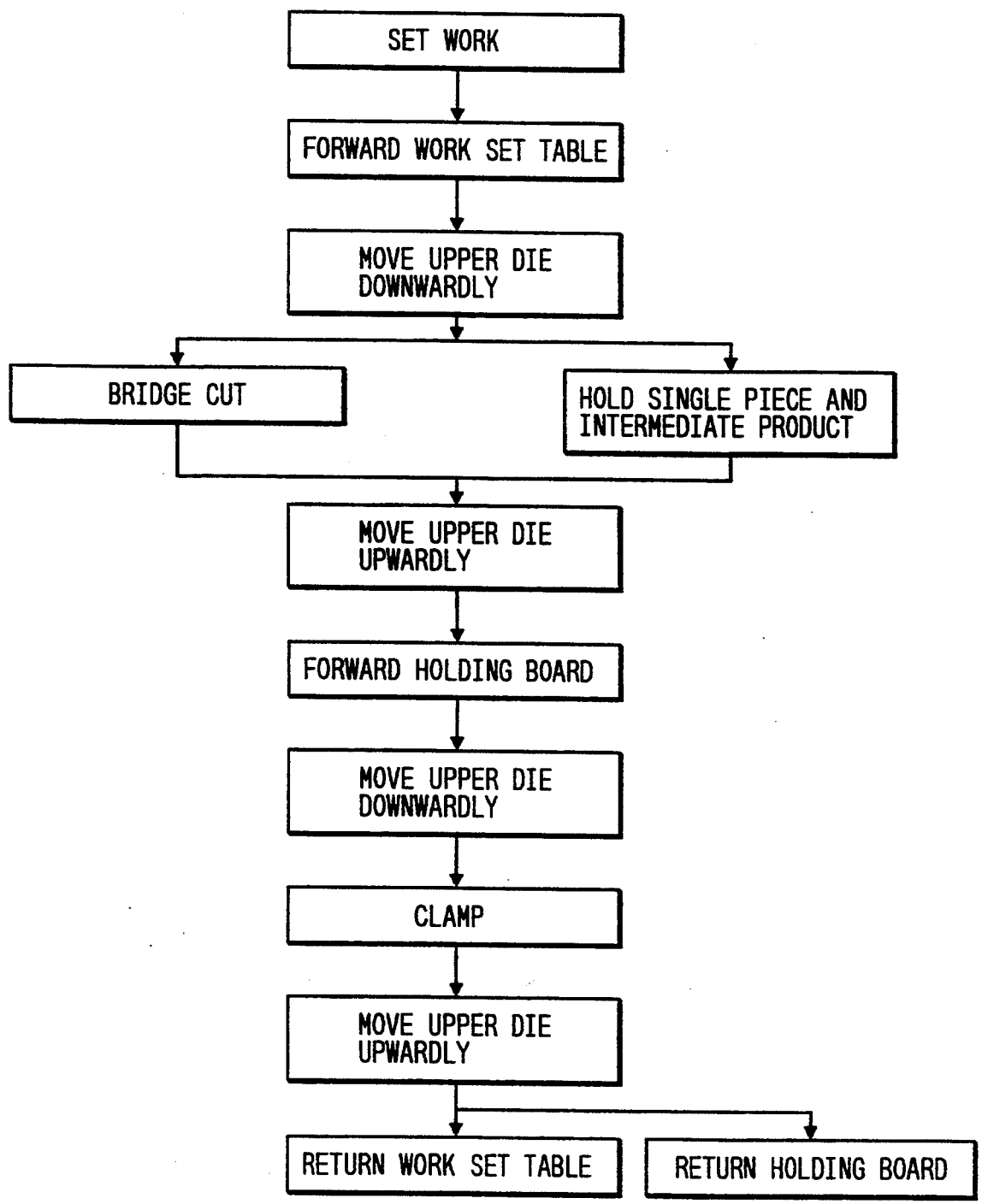
FIG. 19 is a flow chart showing one cycle of operations performed by the device of the invention.

As shown in FIG. 12, the lower die 25 has a substantially U-shaped frame member 31 at the position where the insulating board setting section 5 is located when the workpiece setting table 4 comes in the processing stage P and a die plate 32 at the position where the bus bar setting section 6 is located. The die plate 32 has a number of cutting dies 33, which are used to cut the bridges 2 of the bus bar plate BP (some of them 32 shown in FIG. 12 for simplification in illustration). Each of the cutting dies 33 is in the form of a cylindrical boss, into which the respective cutting punch 19 is inserted. A number of fixing pins 34 are embedded in the upper surface of the die plate 32. The fixing pins 34 are adapted to flatten fixing protrusions 35 (shown in FIGS. 15 and 16), which are extended, through the bus bars B, from the insulating board 3.

A holding section 36 is provided on the lower surface of the upper die 26 (on the left side thereof in FIG. 1). This section 36 operates to lift and hold the insulating board 3 and the intermediate product H, which have been conveyed by the workpiece setting table 4 from the setting stage S to the processing stage P.

A mechanism for lifting and holding the insulating board 3 and the intermediate product H is similar to that described in connection with the first embodiment in conjunction with FIGS. 5 and 6, and therefore, the mechanism will not be further described.

The operations of the device are controlled by a control unit (not shown). A sensor (not shown) is provided for the lower die 25 to detect whether or not the insulating board 3, the intermediate product H, and the bus bar plate BP are correctly positioned on the workpiece setting table 4. Therefore, the bus bar fixing operation is carried out with no errors.

Figure 13:
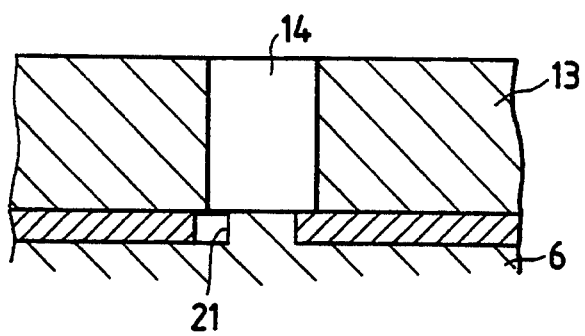
FIG. 13 is a sectional side view illustrating the returning operation of the holding block in the second embodiment.
Figure 14:
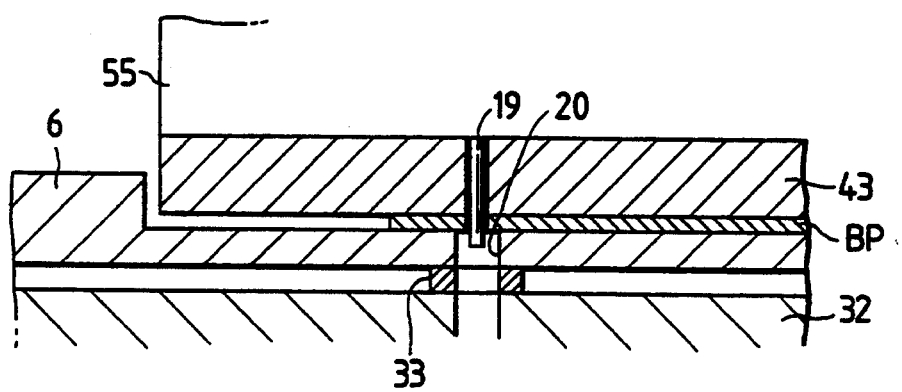
FIG. 14 is a sectional view illustrating an operation of cutting and removing bridges from a bus bar plate with cutting punches in the second embodiment.

The functions and effects of the device thus organized will be described with reference to FIGS. 12 and 13.

Originally, the insulating board 3 and the intermediate product H are set on the workpiece setting table 4. However, in the initial workpiece setting operation, no intermediate product H is set; that is, only the insulating board is set, More specifically, at the insulating board setting section, the insulating board 3 is positioned with the positioning pins 12; and at the bus bar setting section, the bus bar plate is set with the positioning pins 18 with the after-fixing group of bus bars faced toward the processing stage.

Under this condition, the operator operates an operating switch (not shown) to control the supply of air to the cylinder 9, so that the workpiece setting table 4 is moved to the processing stage P while being guided by the rails 7. When the limit switch 11 detects the abutment of the workpiece setting table 4 against the table stoppers 10; that is, when the table 4 is positioned in place, the supply of air to the cylinder 9 is suspended, and the workpiece setting table 4 is held in position.

Thereafter, the upper die 26 is moved downwardly. In this operation, the insulating board 3 is clamped, and the bridges 2 are cut and removed from the bus bar plate BP. The clamping of the insulating board 3 is similar to that of the first embodiment and will not be described in more detail.

After the insulating board 3 has been clamped, the upper die 26 is moved upwardly. The pin plate 49 is thus moved away from the holding board 13, and the holding blocks 14 are released from the ejection pins 50. As the upper die 26 moves upwardly, the insulating board 3 is moved upwardly because the ball plungers 51 are kept locked to the insulating board 3 by their springs 53.

In association with the insulating board clamping operation, the bridge cutting and removing operation is carried out. As the upper die 26 is moved downwardly, the positioning pins 57 of the stripper plate 43 are inserted into the through-holes 22 of the bus bar setting section 6. The stripper plate 43 is elastically brought into contact with the bus bar plate BP. When, under this condition, the upper die 26 is further moved downwardly, as shown in FIG. 8, the cutting punches 19 of the cut punch plate 55 are protruded through the stripper plate 43, so that the bridges 2 are all removed from the bus bar plate B, and so that bus bars B remain while being divided into the after-fixing group of bus bars and the first-fixing group of bus bars. In this operation, the bridges 2 thus removed are thrown away through the cutting dies 33.

After the holding board 13 is held below the stripper plate 43, the upper die 26 is moved downwardly again. As a result, while the holding board 13 is positioning the bus bar setting section 6, the insulating board 3 is laid over the first-fixing group of bus bars B, whereby the first-fixing group of bus bars B are fitted in the insulating board 3 as required, and the fixing protrusions 36 of the insulating board 3 are protruded through the bus bars B and over the lower surface of the bus bar setting section 6. The upper die 26 is further moved downwardly, so that the holding board 13 is brought into close contact with the stripper plate 43, to push the insulating board 3. As a result, the fixing protrusions 35 are flattened by the fixing pins 34, so that the first-fixing group of bus bars B are fixed onto the insulating board 3. During this bus bar fixing operation, the holding board 13 is positioned under the stripper plate 43, thus preventing the cutting punches 19 from reaching the insulating board 3- Simultaneously when the bus bars are fixed onto the insulating board 3, the holding blocks 14 are pushed upwardly by the returning protrusions 21 of the bus bar setting section 6, respectively, so that the ball plungers 51 are disengaged from the insulating board 6, and the holding blocks 15 are set back into the accommodating recesses 45.

As is apparent from the above description, when the insulating board holding board 13 is moved upwardly together with the upper die 26, the insulating board 3 onto which the first-fixing group of bus bars have been fixed and the after-fixing group of bus bars remain on the bus bar setting section 6. After the upper die 26 has been moved upwardly in the above-described manner, the holding board 13 and the workpiece setting table 4 are returned to their original positions by means of the cylinders 9 and 42, respectively. As a result, the intermediate product H (the insulating board on which the first-fixing group of bus bars have been fixed) and the after-fixing group of bus bars are left at the bus bar setting section on the workpiece setting table 4.

The intermediate product H thus obtained is shifted by the operator to the back position, which is closer to the processing stage P, and at the bus bar setting section, the after-fixing group of bus bars left in the initial fixing operation are removed, and a new bus bar plate BP is set.

Under this condition, the following bus bar fixing operation is carried out in the same manner as described above. That is, when the workpiece setting table 4 has been moved to the processing stage P, the holding board 13 raises the insulating board 3 and the intermediate product in the above-described manner, and at the same time the bus bar plate BP is cut. The upper die 26 is moved upwardly, and the holding board 13 is moved toward the stripper plate 43. The upper die 26 is moved downwardly again, so that the insulating board 3 is laid over the first-fixing group of bus bars, while the intermediate product H is laid over the after-fixing group of bus bars. Under this condition, the first-fixing group of bus bars are fixed onto the insulating board 3, and the after-fixing group of bus bars are fixed onto the intermediate product H. Thereafter, the upper die 26 is moved upwardly, and the workpiece setting table 4 is returned to its original position. Thus, the complete product F and the intermediate product H have been formed. The complete product F is removed from the device. The intermediate product H is shifted to the back position in the insulating board setting section 5, so that the bus bar fixing operation can be carried out for it.

As was described above, with the device of the invention, a series of manufacturing steps from the step of cutting and removing the bridges up to the step of fixing the bus bars onto the insulating board are all automatically carried out, and the intermediate product forming operation and the complete product forming operation are performed simultaneously. Thus, the manufacture is achieved with high efficiency. In the device of the invention, the insulating board 3 is held by the locking means including the ball plungers 51, and in clamping the insulating board 3 no vacuum means is employed, nor are compression forces applied to it from both sides. Therefore, the method employed by the device is considerably effective in handling the insulating board 3, which is generally a thin resin plate and is liable to be bent. Hence, with the device of the second embodiment, the bus bars can be smoothly fixed onto the insulating board with high work efficiency.

In the second embodiment of the invention, the bus bar plate of the after-fixing type is cut to obtain the bus bars that are divided into the first-fixing group of bus bars and the after-fixing group of bus bars. The first-fixing group of bus bars are fixed onto the insulating board to form the intermediate product, and the after-fixing group of bus bars are fixed onto the intermediate product to form the complete product. These manufacturing steps are automatically carried out. As a result, the device of the invention is high in work efficiency.

Furthermore, in the device of the invention, the insulating board is locked to the holding board with the locking device. Therefore, with the device of the invention, unlike those using a suction force or compression force to hold the insulating board, the insulating board will never be bent during manufacture, and the bus bars can be smoothly fixed onto the insulating board.

While the embodiments disclosed herein are preferred, it will be appreciated from this teaching that various alternatives, modifications, variations or improvements therein may be made by those skilled in the art that are within the scope of the invention, which is defined by the following claims.

What is claimed is:

1. A device for automatically fixing bus bars onto an insulating board, comprising:
   a setting stage for supporting a bus bar plate and an insulating board parallel to each other, said bus bar plate including a plurality of bus bars and removable bridges through which said bus bars are connected to one another; and
   a processing stage for removing said bridges from said bus bar plate thereby leaving said bus bars, and for fixing said bus bars thus left onto said insulating board, said setting stage comprising a workpiece setting table movable to and from said processing stage, wherein said processing stage comprises a lower die and an upper die, said upper die comprising:
   a plurality of cutting punches for cutting and removing said bridges from said bus bar plate when said workpiece setting table is positioned at said processing stage; and
   an insulating board holding section adjacent said cutting punches, said insulating board holding section raising said insulating board from said workpiece setting table in synchronization with the cutting and removing of said bridges with said cutting punches, said insulating board holding section holding said insulating board thus raised and moving said insulating board to be set below said cutting punches, wherein
   at least one of said upper die and said lower die comprising fixing means for fixing said bus bars onto said insulating board after said insulating board holding section is set below said cutting punches and said insulating board is pushed against said bus bars.

2. A device as claimed in claim 1, wherein said insulating board holding section comprises an insulating board holding board suspended from said upper die, and wherein a plurality of insulating board holding blocks adapted to hold said insulating board are provided in a lower surface of said insulating board holding board such that said insulating board holding blocks surround an outer periphery of said insulating board and are moved in and out of said lower surface of said insulating board holding board as said upper die moves up and down, each of said insulating board holding blocks comprising locking means detachably locked to the outer periphery of said insulating board for holding said insulating board.

3. A device for automatically fixing bus bars onto an insulating board, comprising a base having a setting stage and a processing stage, the setting stage comprising:
   a workpiece setting table having an insulating board setting section for supporting said insulating board and a bus bar setting section for supporting a bus bar plate having said bus bars and a plurality of removable bridges, said insulating board setting section and said bus bar setting section being disposed adjacent one another; and
   means for moving said workpiece setting table between said setting stage and said processing stage; the processing stage comprising:
   a first die having a frame member and a die plate, said die plate having at least one cutting die;
   a second die disposed opposite said first die and movable toward and away from said first die;
   an insulating board holding section connected to said second die and movable between a first position and a second position along said second die, the insulating board holding section comprising means for lifting and holding said insulating board;
   a plurality of cutting punches fixed to said second die for cutting and removing said bridges from said bus bar plate;
   means for moving said insulating board holding section between said first position and said second position such that said insulating board is moved to a position opposite said cutting punches; and
   means for fixing said bus bars onto said insulating board after said insulating board is set to said position opposite said cutting punches.

4. A device as claimed in claim 3, wherein said means for moving said workpiece setting table comprises:
   a pair of rails disposed on said base;
   a pair of rail riders fixed to said workpiece setting table and riding on said pair of rails;
   a cylinder for driving said rail riders on said rails; and
   a coupling bracket fixing at least one of said rail riders to said piston.

5. A device as claimed in claim 4, wherein said cylinder is an air cylinder.

6. A device according to claim 3, wherein said means for lifting and holding said insulating board comprises:
   an insulating board holding board;
   a plurality of insulating board holding blocks disposed in a corresponding plurality of accommodating recesses formed in a first surface of said insulating board holding board;
   at least one holding pin extending from a second surface of said insulating board holding board, said at least one holding pin disposed adjacent said accommodating recesses through said insulating board holding board;
   at least one ejection pin corresponding to said at least one holding pin fixed to said second die, said at least one ejection pin contacting said at least one holding pin when said second die is moved toward said first die, said at least one ejection pin pushing said at least one holding pin into its corresponding one of said accommodating recesses, thereby pushing one of said insulating board holding blocks into a relief recess in said insulating board setting section, past said insulating board; and a ball plunger disposed in a plunger recess in each of said insulating board holding blocks, said ball plunger being urged out of said insulating board holding blocks by a spring, wherein said ball plunger is forced out when said insulating board holding blocks are pushed past said insulating board.

7. A device as claimed in claim 3, wherein said means for moving said insulating board holding section comprises:
a pair of rails fixed to said second die;
a pair of rail riders fixed to said insulating board holding section and riding on said pair of rails;
a cylinder for driving said rail riders on said rails; and
a coupling bracket fixing at least one of said rail riders to said piston.

8. A device as claimed in claim 7, wherein said cylinder is an air cylinder.

9. A device as claimed in claim 3, wherein said insulating board setting section further comprises means for supporting an intermediate product adjacent said insulating board, and wherein said bus bar setting section comprises means for supporting a first-fixing group of bus bars and an after-fixing group of bus bars adjacent said first-fixing group of bus bars, said insulating board holding section further comprising means for lifting and holding said intermediate product.

10. A device as claimed in claim 9, wherein said means for moving said workpiece setting table comprises:
a pair of rails disposed on said base;
a pair of rail riders fixed to said workpiece setting table and riding on said pair of rails;
a cylinder for driving said rail riders on said rails; and
a coupling bracket fixing at least one of said rail riders to said piston.

11. A device as claimed in claim 10, wherein said cylinder is an air cylinder.

12. A device according to claim 9, wherein said means for lifting and holding said insulating board and said means for lifting and holding said intermediate product comprise:
an insulating board holding board;
a plurality of insulating board holding blocks disposed in a corresponding plurality of accommodating recesses formed in a first surface of said insulating board holding board;
at least one holding pin extending from a second surface of said insulating board holding board, said at least one holding pin disposed adjacent said accommodating recesses through said insulating board holding board;
at least one ejection pin corresponding to said at least one holding pin fixed to said second die, said at least one ejection pin contacting said at least one holding pin when said second die is moved toward said first die, said at least one ejection pin pushing said at least one holding pin into its corresponding one of said accommodating recesses, thereby pushing one of said insulating board holding blocks into a relief recess in said insulating board setting section, past said insulating board and said intermediate product; and
a ball plunger disposed in a plunger recess in each of said insulating board holding blocks, said ball plunger being urged out of said insulating board holding blocks by a spring, wherein said ball plunger is forced out when said insulating board holding blocks are pushed past said insulating board and said intermediate product.

13. A device as claimed in claim 9, wherein said means for moving said insulating board holding section comprises:
a pair of rails fixed to said second die;
a pair of rail riders fixed to said insulating board holding section and riding on said pair of rails;
a cylinder for driving said rail riders on said rails; and
a coupling bracket fixing at least one of said rail riders to said piston.

14. A device as claimed in claim 13, wherein said cylinder is an air cylinder.

15. A device for automatically fixing bus bars onto an insulating board, comprising:
a workpiece setting table supporting a bus bar plate comprising said bus bars dividable into a first-fixing group of bus bars, which are firstly fixed onto said insulating board, and an after-fixing group of bus bars, which are separably coupled to said first-fixing group of bus bars and are fixed onto said insulating board onto which said first-fixing group of bus bars have been fixed, said insulating board onto which said first-fixing group of bus bars are fixed forming an intermediate product, wherein said intermediate product is disposed parallel to another insulating board on said workpiece setting table;
a pair of upper and lower dies comprising means for cutting said bus bar plate and for fixing said first-fixing group of bus bars on said insulating board and said after-fixing group of bus bars onto said intermediate product; and
means for moving said workpiece setting table to and from said upper and lower dies;
said upper die comprising:
cutting punches for cutting said bus bar plate when said workpiece setting table is moved to said dies,
a holding section adjacent said cutting punches, said holding section comprising means for lifting said insulating board and said intermediate product from said workpiece setting table in synchronization with the cutting of said bus bar plate with said cutting punches, and for holding said insulating board and said intermediate product, and
means for moving said holding section to and from a position opposite said cutting punches, wherein
at least one of said upper and lower dies comprising fixing means for fixing said first-fixing group of bus bars onto said insulating board and said after-fixing group of bus bars onto said intermediate product when, after said holding section is set opposite said cutting punches by said holding section moving means, said dies are closed.

16. A device as claimed in claim 1, wherein said holding section comprises:
a holding board suspended from said upper die; and
a plurality of holding blocks adapted to hold said insulating board and said intermediate product, said plurality of holding blocks being disposed in a lower surface of said holding board such that said holding blocks surround the outer peripheries of said insulating board and said intermediate product, said holding blocks being movable in and out of said lower surface of said holding board as said upper die moves up and down, wherein each of said holding blocks comprises locking means for detachably locking to the outer peripheries of said insulating board and said intermediate product.

* * * * *